(12) United States Patent
Dutta et al.

(10) Patent No.: US 11,152,261 B2
(45) Date of Patent: Oct. 19, 2021

(54) SELF-ALIGNED TOP VIA FORMATION AT LINE ENDS

(71) Applicant: International Business Machines Corporation, Armonk, NY (US)

(72) Inventors: Ashim Dutta, Menands, NY (US); John Arnold, North Chatham, NY (US); Dominik Metzler, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 16/664,830

(22) Filed: Oct. 26, 2019

(65) Prior Publication Data

US 2021/0125865 A1 Apr. 29, 2021

(51) Int. Cl.
*H01L 21/768* (2006.01)
*H01L 21/033* (2006.01)
(Continued)

(52) U.S. Cl.
CPC .... *H01L 21/76897* (2013.01); *H01L 21/0332* (2013.01); *H01L 21/0335* (2013.01);
(Continued)

(58) Field of Classification Search
CPC ........... H01L 21/76897; H01L 21/0332; H01L 21/0335; H01L 21/0337; H01L 21/0338;
(Continued)

(56) References Cited

U.S. PATENT DOCUMENTS

| 6,974,770 B2 | 12/2005 | Costrini et al. |
| 8,518,824 B2 | 8/2013 | Arnold et al. |

(Continued)

FOREIGN PATENT DOCUMENTS

| CN | 101908522 A | 12/2010 |
| CN | 106373921 A | 2/2017 |

(Continued)

OTHER PUBLICATIONS

International Search Report and Written Opinion for PCT/IB2020/058933 dated Jan. 15, 2021 (10 pages).
(Continued)

*Primary Examiner* — Tong-Ho Kim
(74) *Attorney, Agent, or Firm* — Abdy Raissinia; Michael J. Chang, LLC

(57) ABSTRACT

Techniques for self-aligned top via formation at line ends are provided. In one aspect, a method of forming self-aligned vias at line ends includes: patterning (even/odd) metal lines including using a (first/second) hardmask; cutting the hardmask and a select metal line, even or odd, using a cut mask having a window that exposes the hardmask over a cut region of the select metal line; enlarging the window to expose the hardmask on either side of the cut region; selectively etching the hardmask using the enlarged window to form a T-shaped cavity within the cut region; filling the T-shaped cavity with a gap fill dielectric; removing the hardmask; and recessing the metal lines, wherein the gap fill dielectric overhangs portions of the select metal line that, by the recessing, form the self-aligned vias at ends of the metal lines. A structure is also provided.

24 Claims, 11 Drawing Sheets

(51) Int. Cl.
*H01L 23/522* (2006.01)
*H01L 23/532* (2006.01)

(52) U.S. Cl.
CPC ...... *H01L 21/0337* (2013.01); *H01L 21/0338* (2013.01); *H01L 23/5226* (2013.01); *H01L 23/53209* (2013.01); *H01L 23/53242* (2013.01); *H01L 23/53257* (2013.01)

(58) Field of Classification Search
CPC .......... H01L 23/5226; H01L 23/53209; H01L 23/53242; H01L 23/53257
USPC ....................................................... 257/758
See application file for complete search history.

(56) References Cited

U.S. PATENT DOCUMENTS

| | | |
|---|---|---|
| 8,796,859 B2 | 8/2014 | Kim |
| 9,564,577 B1 | 2/2017 | Hsu et al. |
| 9,793,164 B2 | 10/2017 | Machkaoutsan et al. |
| 9,818,641 B1 | 11/2017 | Bouche et al. |
| 10,020,223 B1* | 7/2018 | Anderson ......... H01L 21/76883 |
| 10,242,911 B2 | 3/2019 | Clevenger et al. |
| 2010/0283128 A1 | 11/2010 | Chen |
| 2017/0025346 A1 | 1/2017 | Yao et al. |
| 2017/0140986 A1 | 5/2017 | Machkaoutsan et al. |
| 2017/0263553 A1 | 9/2017 | Schenker et al. |
| 2017/0271202 A1 | 9/2017 | Xu et al. |

FOREIGN PATENT DOCUMENTS

| | | |
|---|---|---|
| CN | 107481923 A | 12/2017 |
| CN | 107863308 A | 3/2018 |
| CN | 209087831 U | 7/2019 |

OTHER PUBLICATIONS

S. Paolillo et al., "Direct metal etch of ruthenium for advanced interconnect," J. Vac. Sci. Technol. B 36(3) (May 2018) (9 pages).

* cited by examiner

A portion of the cut metal line is now exposed on either side of the cut region

A-A'

B-B'

US 11,152,261 B2

SELF-ALIGNED TOP VIA FORMATION AT LINE ENDS

FIELD OF THE INVENTION

The present invention relates to top via formation, and more particularly, to techniques for self-aligned top via formation at line ends.

BACKGROUND OF THE INVENTION

In semiconductor device metallization processes, a via is oftentimes formed over a metal line. However, alignment issues can arise with such a top via scheme especially when the via is being formed over the end of the metal line.

Namely, one of the challenges in a top via scheme is to form vias at line ends without any variation in the critical dimension (CD) of the vias. Controlling via CD is, however, difficult if alignment with the metal line is done using lithography. Namely, finite overlay shift can cause the via to either move away from the line end or get cut off by the line end causing via CD reduction. Overlay shift can occur due to pattern-to-pattern misalignment during the lithography process.

Thus, improved techniques for top via formation would be desirable.

SUMMARY OF THE INVENTION

The present invention provides techniques for self-aligned top via formation at line ends. In one aspect of the invention, a method of forming self-aligned vias at line ends is provided. The method includes: patterning metal lines including alternating even and odd metal lines using a hardmask including a first hardmask for patterning the even metal lines and a second hardmask for patterning the odd metal lines; cutting the hardmask and a select metal line, even or odd, using a cut mask having a window that exposes the hardmask over a cut region of the select metal line; enlarging the window in the cut mask to expose the hardmask on either side of the cut region of the select metal line; selectively etching the hardmask using the enlarged window in the cut mask to form a T-shaped cavity within the cut region of the select metal line; filling the T-shaped cavity with a gap fill dielectric; removing the hardmask; and recessing the metal lines selective to the gap fill dielectric, wherein the gap fill dielectric overhangs portions of the select metal line that, by the recessing, form the self-aligned vias at ends of the metal lines.

In another aspect of the invention, another method of forming self-aligned vias at line ends is provided. The method includes: patterning metal lines including alternating even and odd metal lines using a hardmask including a first hardmask for patterning the even metal lines and a second hardmask for patterning the odd metal lines; cutting the first hardmask and a select one of the even metal lines using a first cut mask having a window that exposes the first hardmask over a cut region of the select even metal line; enlarging the window in the first cut mask to expose the first hardmask on either side of the cut region of the select even metal line; selectively etching the first hardmask using the enlarged window in the first cut mask to form a first T-shaped cavity within the cut region of the select even metal line; cutting the second hardmask and a select one of the odd metal lines using a second cut mask having a window that exposes the second hardmask over a cut region of the select odd metal line; enlarging the window in the second cut mask to expose the second hardmask on either side of the cut region of the select odd metal line; selectively etching the second hardmask using the enlarged window in the second cut mask to form a second T-shaped cavity within the cut region of the select odd metal line; filling the first T-shaped cavity and the second T-shaped cavity with a gap fill dielectric; removing the first hardmask and the second hardmask; and recessing the metal lines selective to the gap fill dielectric, wherein the gap fill dielectric overhangs portions of the select even metal line and the select odd metal line that, by the recessing, form the self-aligned vias at ends of the metal lines.

In yet another aspect of the invention, yet another method of forming self-aligned vias at line ends is provided. The method includes: patterning metal lines including alternating even and odd metal lines using a hardmask including a first hardmask for patterning the even metal lines and a second hardmask for patterning the odd metal lines; cutting the first hardmask and a select one of the even metal lines using a first cut mask having a window that exposes the first hardmask over a cut region of the select even metal line; enlarging the window in the first cut mask to expose the first hardmask on either side of the cut region of the select even metal line; selectively etching the first hardmask using the enlarged window in the first cut mask to form a first T-shaped cavity within the cut region of the select even metal line; cutting the second hardmask and a select one of the odd metal lines using a second cut mask having a window that exposes the second hardmask over a cut region of the select odd metal line; enlarging the window in the second cut mask to expose the second hardmask on either side of the cut region of the select odd metal line; selectively etching the second hardmask using the enlarged window in the second cut mask to form a second T-shaped cavity within the cut region of the select odd metal line; cutting the first hardmask using a mask having a window that exposes the first hardmask over a non-line-end of one of the even metal lines to form a gap in the first hardmask; cutting the second hardmask using another mask having a window that exposes the second hardmask over a non-line-end of one of the odd metal lines to form a gap in the second hardmask; filling the first T-shaped cavity, the second T-shaped cavity, the gap in the first hardmask, and the gap in the second hardmask with a gap fill dielectric; removing the first hardmask and the second hardmask; and recessing the metal lines selective to the gap fill dielectric, wherein the gap fill dielectric overhangs portions of the even metal lines that, by the recessing, form the self-aligned vias at ends of the even and odd metal lines, and wherein the recessing of the metal lines selective to the gap fill dielectric in the gap in the first hardmask and the gap fill dielectric in the gap in the second hardmask forms non-line-end vias.

In still yet another aspect of the invention, a structure is provided. The structure includes: metal lines; a cut in a select one of the metal lines; vias aligned with line ends of the select metal line on either side of the cut; and a gap fill dielectric in between the line ends.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming self-aligned top vias at line ends that employ a cut lithography to define line cuts first and then widening the cut region mask opening and transferring the pattern to the underlying metal line hardmask layer. The enlarged opening is then subsequently filled with a dielectric to form a mask for the self-aligned top via at the line ends. As will be described in detail below, the present techniques place vias on both sides of the line cut region (i.e., at the line ends). Advantageously, there is no via critical dimension (CD) variation which would otherwise arise from lithographically aligning the via to a previously-formed line cut. Also, with the present process, the via CD at the line end is controlled by the amount of lateral etch of the hardmask.

Figure 1:
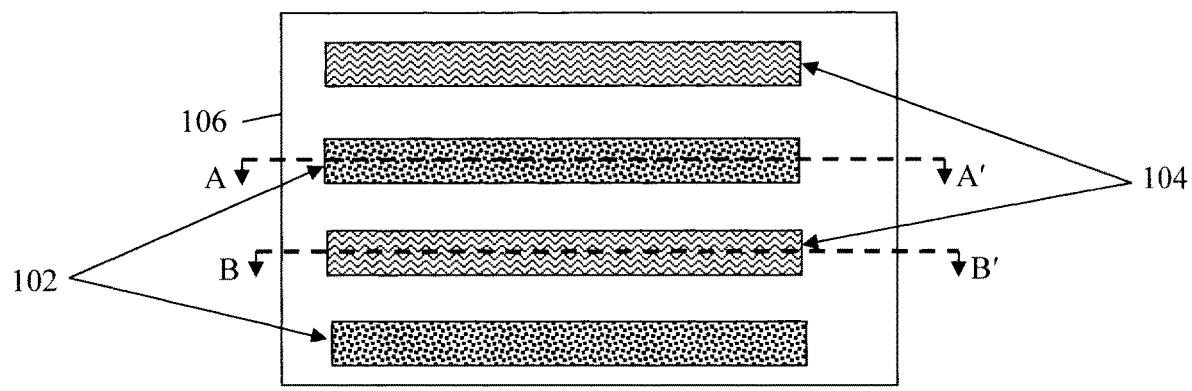
FIG. 1 is a top-down diagram illustrating a first hardmask for patterning even metal lines and a second hardmask for patterning odd metal lines, and a dielectric material having been deposited over/surrounding the (even/odd) metal lines and the first and second hardmasks according to an embodiment of the present invention.

An exemplary methodology for forming self-aligned vias at line ends is now described by way of reference to FIGS. 1-25. As shown in FIG. 1 (a top down view), the process begins with the patterning of even metal lines using a first hardmask 102 and odd metal lines using a second hardmask 104. The terms 'even' and 'odd' are used herein to refer to alternating metal lines. The designation of which metal lines are even and which are odd is arbitrary. However, if a given metal line is even then the next adjacent metal line is odd, or vice versa. The terms 'first' and 'second' may also be used herein to refer to the even and odd metal lines, respectively.

It is notable that the following description illustrates forming self-aligned vias at the even/odd metal line ends, as well as non-line-end vias over the even/odd metal line ends. It is to be understood, however, that the present techniques can be implemented to form any of these line end and/or non-line end vias for the even/odd metal lines, singularly or in combination, and in any order. For instance, one may choose to implement the present techniques simply to form line end vias over the even and/or odd metal line ends, and/or to form non-line end vias for the even and/or odd metal lines.

The present approach requires different hardmasks (formed from different materials) for even and odd metal lines. As will become apparent from the description that follows, this dual hardmask configuration allows for the selective cut of even versus odd metal lines, and vice versa. According to an exemplary embodiment, first hardmask 102 is formed from a material such as titanium (Ti), tantalum (Ta), titanium oxide (TiOx), titanium nitride (TiN) and/or tantalum nitride (TaN), and second hardmask 104 is formed from a material such as silicon nitride (SiN), silicon carbon nitride (SiCN), hydrogen containing silicon carbon nitride (SiCNH) and/or silicon carbide (SiC). First and second hardmasks 102 and 104 can be patterned using a patterning technique such as lithography followed by an etching process. Suitable etching processes include, but are not limited to, a directional (anisotropic) etching process such as reactive ion etching (RIE). Alternatively, the first and second hardmasks 102 and 104 can be formed by any other suitable techniques, including but not limited to, sidewall image transfer (SIT), self-aligned double patterning (SADP), self-aligned quadruple patterning (SAQP), and other self-aligned multiple patterning (SAMP).

A directional (anisotropic) etching process such as RIE can be employed to form the even and odd metal lines using the first and second hardmasks 102 and 104, respectively. Namely, the first and second hardmasks 102 and 104 are formed on a metal layer (not explicitly shown in the figures) which is then patterned into the individual even and odd metal lines. Suitable metals for the metal layer/metal lines include, but are not limited to, tungsten (W), cobalt (Co) and/or ruthenium (Ru).

A dielectric material 106 is then deposited over/surrounding the (even/odd) metal lines and the first and second hardmasks 102 and 104, followed by a polishing process such as chemical-mechanical polishing (CMP) to remove excess dielectric. Suitable dielectric materials 106 include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

Figure 2:
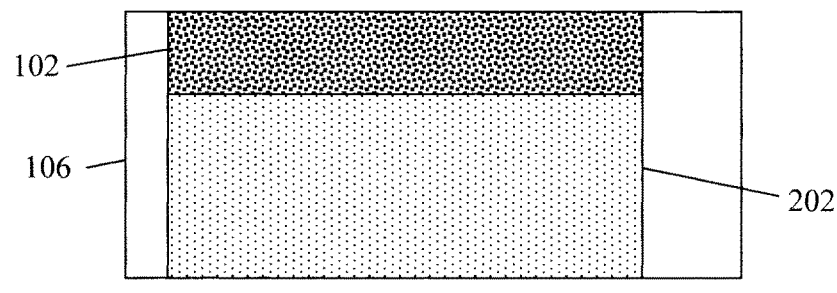
FIG. 2 is a cross-sectional diagram (A-A') illustrating the first hardmask over one of the even metal lines according to an embodiment of the present invention.
Figure 3:
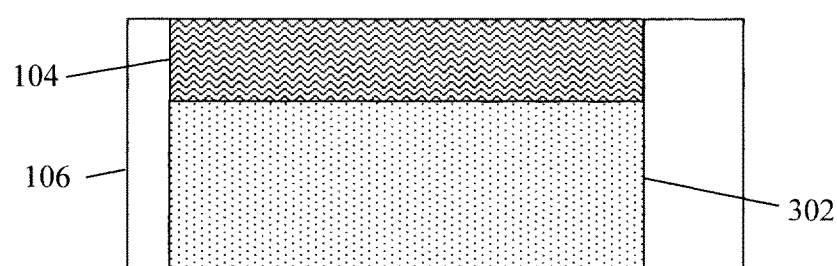
FIG. 3 is a cross-sectional diagram (B-B') illustrating the second hardmask over one of the odd metal lines according to an embodiment of the present invention.
Figure 4:
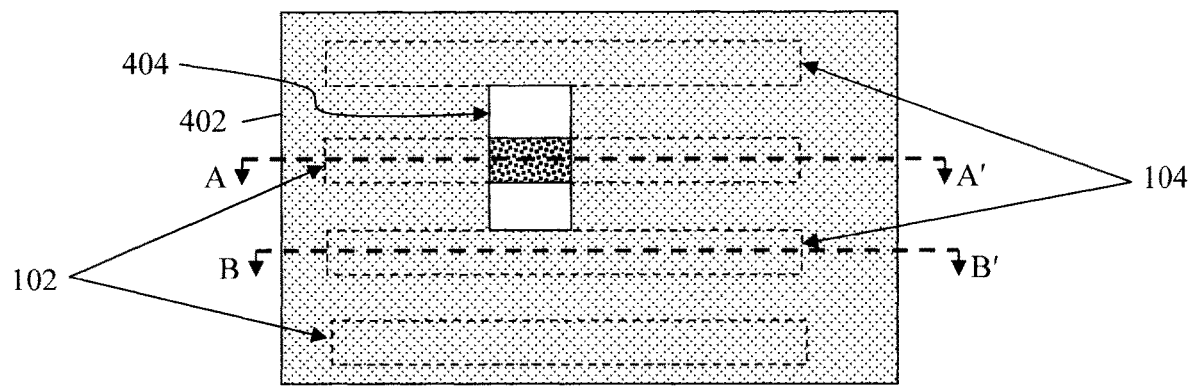
FIG. 4 is a top-down diagram illustrating a (first) cut mask having been formed over the first and second hardmasks having a window exposing the first hardmasks over a cut region of a select one of the even metal lines to be cut according to an embodiment of the present invention.

FIG. 2 is a cross-sectional diagram (along line A-A'—see FIG. 1) illustrating a first hardmask 102 over an even metal line 202. FIG. 3 is a cross-sectional diagram (along line B-B'—see FIG. 1) illustrating a second hardmask 104 over an odd metal line 302.

An even metal line 202 cut is then performed. To do so, a (first) cut mask 402 is formed over the first and second hardmasks 102 and 104. See FIG. 4 (a top-down view). A window 404 (exposing the cut region) is present in cut mask 402 over one of the first hardmasks 102 (over a select one of the even metal lines 202 to be cut). According to an exemplary embodiment, cut mask 402 is formed from a multi-layer lithographic stack that includes, but is not limited to, a photoresist disposed over an anti-reflective coating (ARC) and an organic planarizing layer (OPL). Ideally, window 404 opens only the first hardmask 102 over the select even metal line 202 to be cut (i.e., the desired cut region). However, as will be illustrated in FIG. 6 and described below, the use of different hardmasks for even and odd metal lines enlarges the process window since a different/second hardmask 104 is present over and protecting the adjacent odd metal lines.

Figure 5:
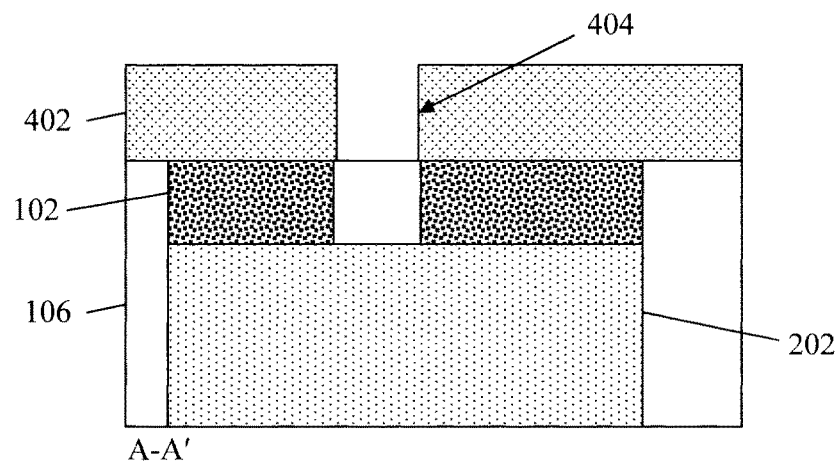
FIG. 5 is a cross-sectional diagram (A-A') illustrating the first cut mask having been used to pattern/cut the first hardmask over the select even metal line according to an embodiment of the present invention.
Figure 6:
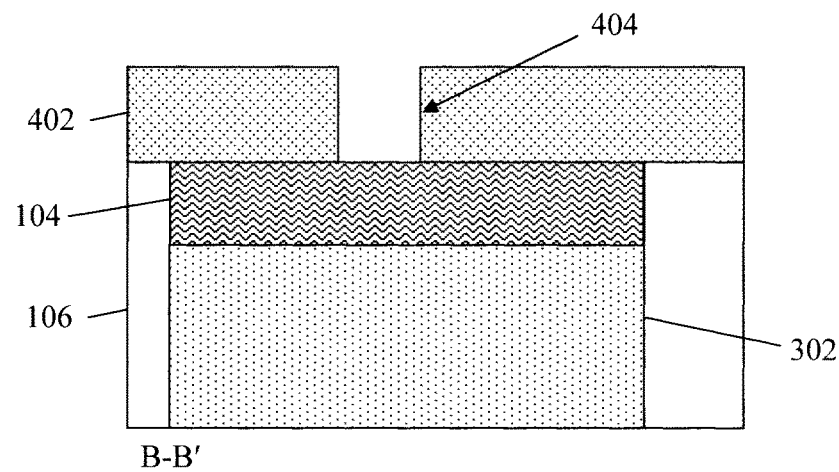
FIG. 6 is a cross-sectional diagram (B-B') illustrating that even if the window in the first cut mask encroaches an adjacent odd metal line, no cut of that odd metal line occurs due to the use of different first and second hardmasks according to an embodiment of the present invention.

FIG. 5 is a cross-sectional diagram (along line A-A') illustrating cut mask 402 having been used to pattern/cut the first hardmask 102 over a select even metal line 202 to be cut. As shown in FIG. 6 (a cross-sectional diagram (along line B-B') even if window 404 encroaches the adjacent odd metal line 302, that odd metal line 302 is protected by the second hardmask 104 (i.e., a different hardmask material—see above). Thus, no cut of that odd metal line 302 occurs. By way of example only, a plasma etching process using chlorine-containing plasma can be used to selectively etch hardmask 102.

Figure 7:
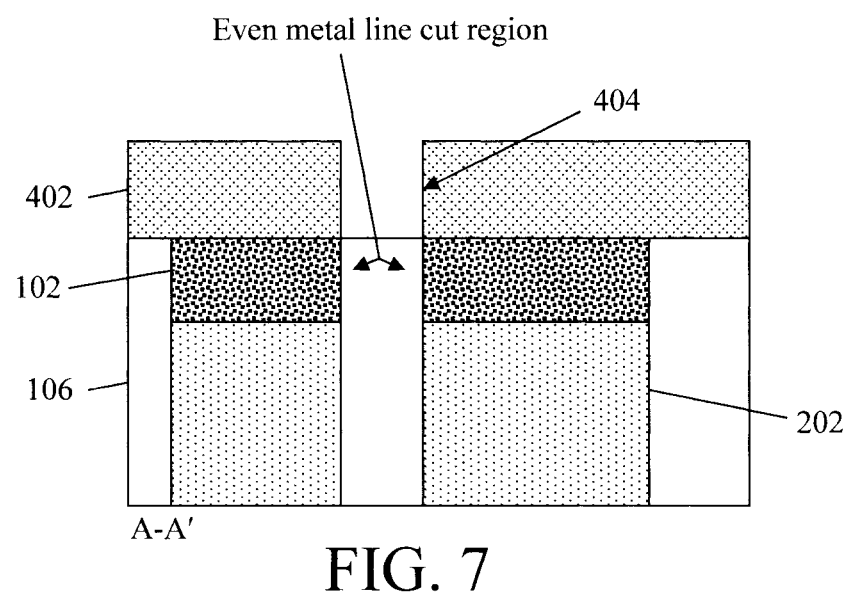
FIG. 7 is a cross-sectional diagram (A-A') illustrating the pattern from the first hardmask having been transferred to the select even metal line, cutting that even metal line according to an embodiment of the present invention.

FIG. 7 is a cross-sectional diagram (along line A-A') illustrating the pattern from the first hardmask 102 having been transferred to the select even metal line 202, cutting that even metal line 202. A directional (anisotropic) etching process such as RIE can be employed for the metal line cut.

Figure 8:
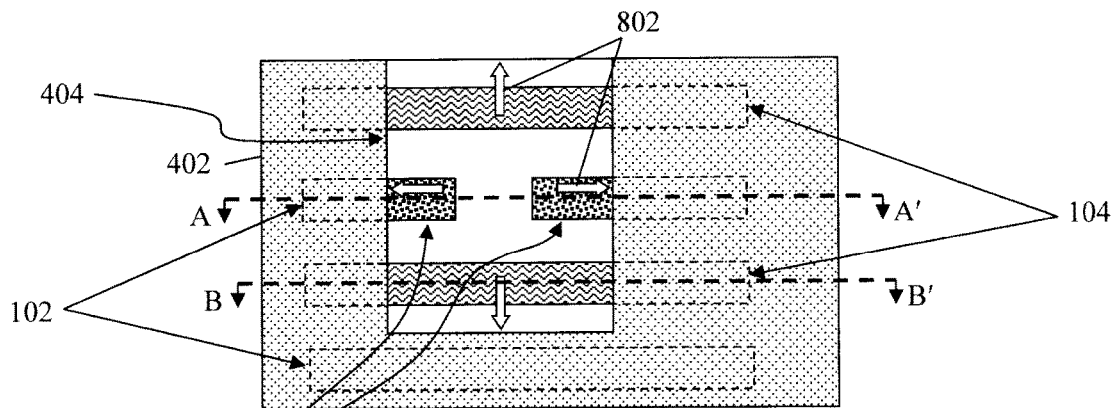
FIG. 8 is a top-down diagram illustrating a lateral etching of first cut mask having been performed to enlarge the window according to an embodiment of the present invention.

As shown in FIG. 8 (a top down view), a lateral etching (see arrows 802) of cut mask 402 is then performed to enlarge window 404. This enlarging/widening of window 404 defines the width of the via which, based on the lateral etching, is now placed on both sides of the line cut region (i.e., at the ends the select even metal line 202 that has been cut). According to an exemplary embodiment, this lateral etching of cut mask 402 is performed using oxygen plasma etching. Care must be taken to widen/enlarge the window 404 enough to expose portions of the first hardmask 102 over the select (even) metal line on either side of the cut region, without widening the window 404 too much that the first hardmask 102 over another, different even metal line 202 is exposed.

Figure 9:
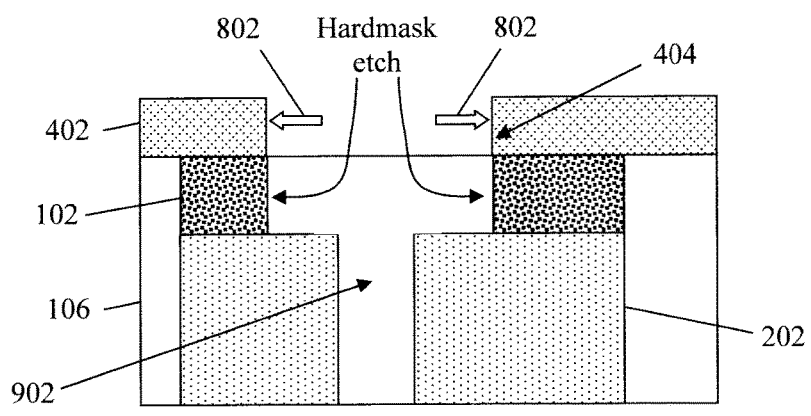
FIG. 9 is a cross-sectional diagram (A-A') illustrating the first cut mask after the window has been enlarged/widened by the lateral etching, and the first cut mask having been used to selectively etch portions of the first hardmask over the select (even) metal line on either side of the cut region exposed by the enlarged/widened window to form a (first) "T-shaped" cavity according to an embodiment of the present invention.

FIG. 9 is a cross-sectional diagram (along line A-A') illustrating cut mask 402 after window 404 has been enlarged/widened by the lateral etching. As described above, enlarging the window 404 exposes portions of the first hardmask 102 over the select (even) metal line on either side of the cut region. Next, as shown in FIG. 9, cut mask 402 is used to selectively etch those portions of the first hardmask 102 over the select (even) metal line on either side of the cut region exposed by the enlarged/widened window 404. As provided above, a plasma etching process using chlorine-containing plasma can be used to selectively etch hardmask 102. As shown in FIG. 9, the etched first hardmask 102 over the cut region of the select even metal line forms a (first) "T-shaped" cavity 902.

Figure 10:
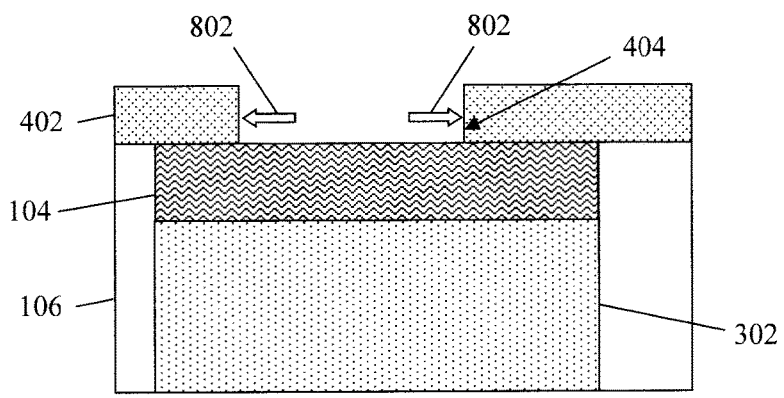
FIG. 10 is a cross-sectional diagram (B-B') illustrating that even if the now-enlarged window of the first cut mask encroaches the second hardmask over the adjacent odd metal line, use of different first/second hardmask materials and a selective etch prevents any etching of the second hardmask from occurring according to an embodiment of the present invention.

As shown in FIG. 10 (a cross-sectional diagram (along line B-B')) even if the now-enlarged window 404 encroaches the adjacent second hardmask 104/odd metal line 302, use of different first/second hardmask materials and a selective etch prevents any etching of the second hardmask 104 from occurring. After the first hardmask 102 over the select (even) metal line on either side of the cut region has been etched through the enlarged window 404, cut mask 402 is removed.

Figure 11:
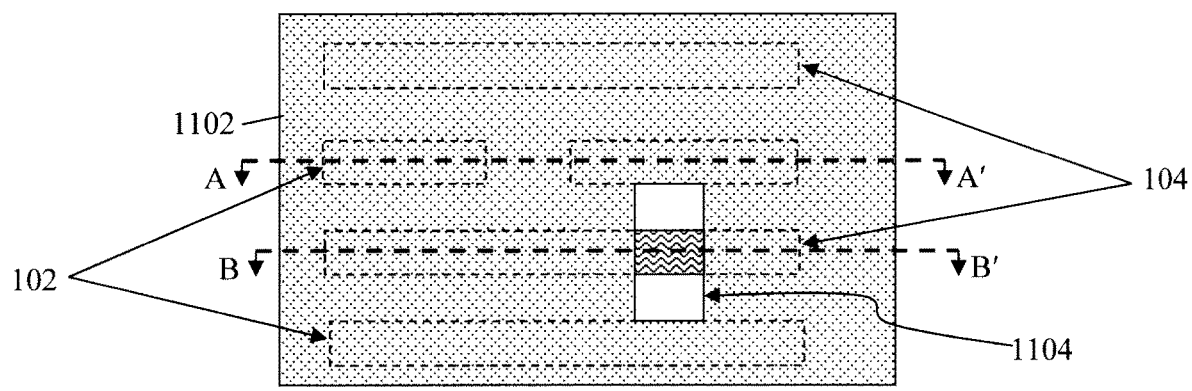
FIG. 11 is a top-down diagram illustrating a (second) cut mask having been formed over the first and second hardmasks having a window exposing the second hardmasks over a cut region of a select one of the odd metal lines to be cut according to an embodiment of the present invention.
Figure 12:
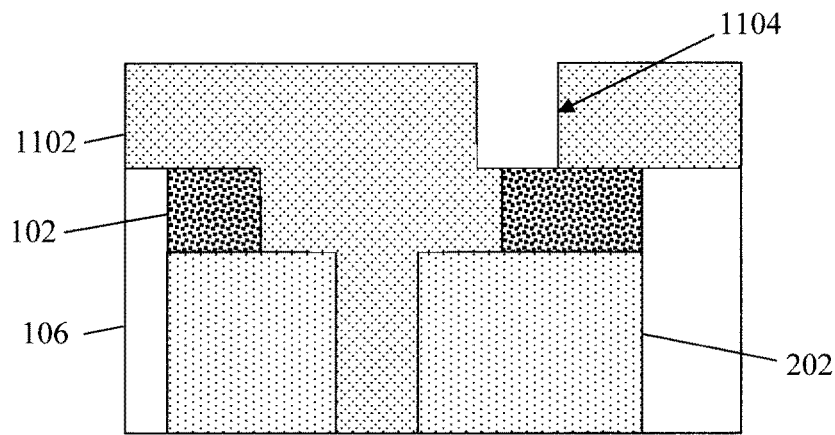
FIG. 12 is a cross-sectional diagram (A-A') illustrating that even if the window in the second cut mask encroaches an adjacent even metal line, no cut of that even metal line occurs due to the use of different first and second hardmasks according to an embodiment of the present invention.

The same general process is then used to cut a select one of the odd metal lines 302. Namely, as shown in FIG. 11 (a top-down view), a (second) cut mask 1102 is formed over the first and second hardmasks 102 and 104. A window 1104 (exposing the cut region) is present in cut mask 1102 over one of the second hardmasks 104 (over a select one of the odd metal lines 302 to be cut). According to an exemplary embodiment, cut mask 1102 is formed from a multi-layer lithographic stack such as a photoresist/ARC/OPL stack. Ideally, window 1104 opens only the second hardmask 104 over the select odd metal line 302 to be cut (i.e., the desired cut region). However, the use of different hardmasks for even and odd metal lines enlarges the process window since a different/first hardmask 102 is present over and protecting the adjacent even metal lines. Namely, as shown in FIG. 12 (a cross-sectional diagram (along line A-A') even if window 1104 encroaches the adjacent even metal line 202, that even metal line 202 is protected by the first hardmask 102 (i.e., a different hardmask material—see above). Thus, no cut of that even metal line 202 occurs. By way of example only, a plasma etching process using fluorocarbon plasma can be used to selectively etch hardmask 104. Further, as shown in FIG. 12, cut mask 1102 fills the T-shaped cavity 902 in the cut region of the select even metal line.

Figure 13:
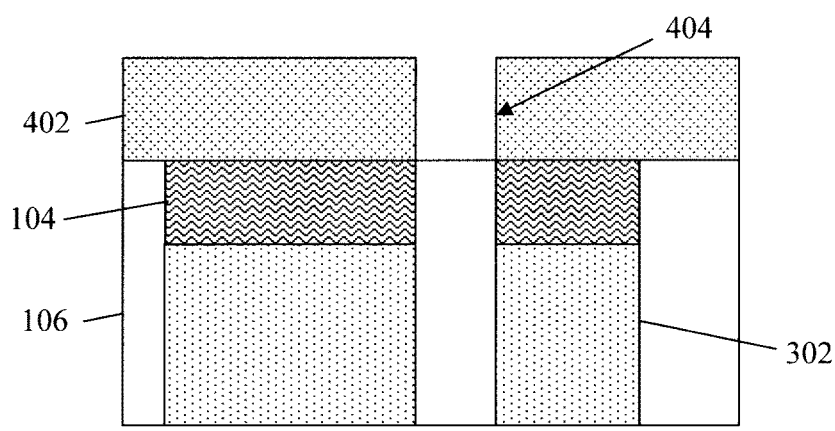
FIG. 13 is a cross-sectional diagram (B-B') illustrating the second cut mask having been used to pattern/cut the second hardmask over the select odd metal line, and the pattern from the second hardmask having been transferred to the select odd metal line, cutting that odd metal line according to an embodiment of the present invention.

FIG. 13 is a cross-sectional diagram (along line B-B') illustrating cut mask 1102 having been used to pattern/cut the second hardmask 104 over a select odd metal line 203, and the pattern from the second hardmask 104 having been transferred to the select odd metal line 302, cutting that odd metal line 302. A directional (anisotropic) etching process such as RIE can be employed for the metal line cut. While combined in FIG. 13, the individual hardmask and metal line patterning steps (in that case for patterning a select even metal line) were depicted in FIG. 5 and FIG. 7, described above.

Figure 14:
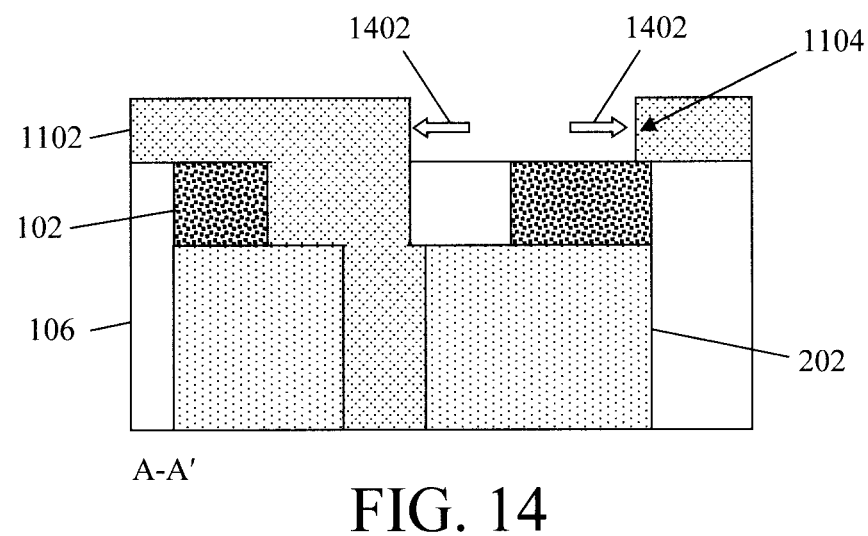
FIG. 14 is a cross-sectional diagram (A-A') illustrating, following lateral etching of first cut mask having been performed to enlarge the window, that even if the now-enlarged window of the second cut mask encroaches the first hardmask over the adjacent even metal line, use of different first/second hardmask materials and a selective etch prevents any etching of the first hardmask from occurring according to an embodiment of the present invention.

A lateral etching of cut mask 1102 is then performed to widen window 1104 over the second hardmask 104 and select odd metal line 302. As shown in FIG. 14, a cross-sectional diagram (along line A-A'), even if the now-enlarged window 1104 (see arrows 1402) encroaches the adjacent first hardmask 102/even metal line 202, use of different first/second hardmask materials and a selective etch prevents any etching of the first hardmask 102 from occurring.

As described above, this widening of window 1104 defines the width of the via which, based on the lateral etching, is now placed on both sides of the line cut region (i.e., at the ends the select odd metal line 302 that has been cut). According to an exemplary embodiment, this lateral etching of cut mask 1102 is performed using oxygen plasma etching. Care must be taken to widen/enlarge the window 1104 enough to expose portions of the second hardmask 104 over the select (odd) metal line on either side of the cut region, without widening the window 1104 too much that the second hardmask 104 over another, different odd metal line 302 is exposed.

Figure 15:
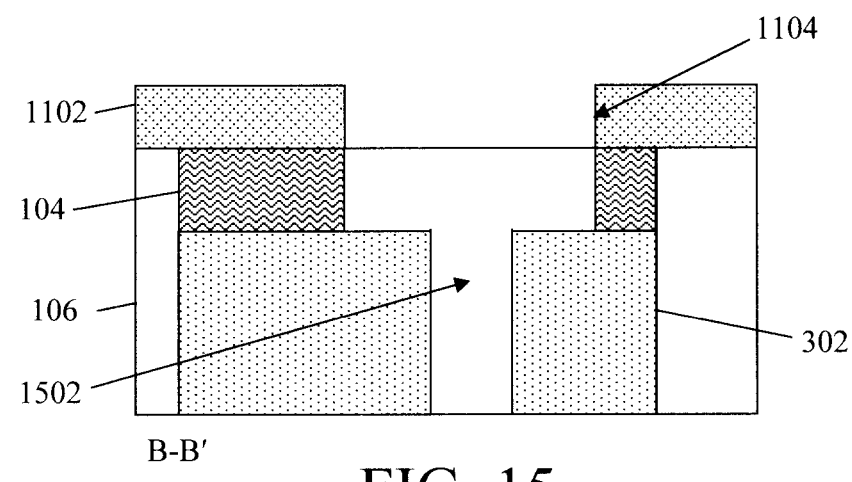
FIG. 15 is a cross-sectional diagram (B-B') illustrating the second cut mask after the window has been enlarged/widened by the lateral etching, and the second cut mask having been used to selectively etch portions of the second hardmask over the select (odd) metal line on either side of the cut region exposed by the enlarged/widened window to form a (second) "T-shaped" cavity according to an embodiment of the present invention.

FIG. 15 is a cross-sectional diagram (along line B-B') illustrating cut mask 1102 after window 1104 has been enlarged/widened by the lateral etching. As described above, enlarging the window 404 exposes portions of the second hardmask 104 over the select (odd) metal line on either side of the cut region. Next, as shown in FIG. 15, cut mask 1102 is used to selectively etch those portions of the second hardmask 104 over the select (odd) metal line on either side of the cut region exposed by the enlarged/widened window 1104. As provided above, a plasma etching process using fluorocarbon plasma can be used to selectively etch hardmask 104. As shown in FIG. 15, the etched second hardmask 104 over the cut region of the select odd metal line forms a (second) "T-shaped" cavity 1502. After the second hardmask 104 over the select (odd) metal line on either side of the cut region has been etched through the enlarged window 1104, cut mask 1102 is removed.

Figure 16:
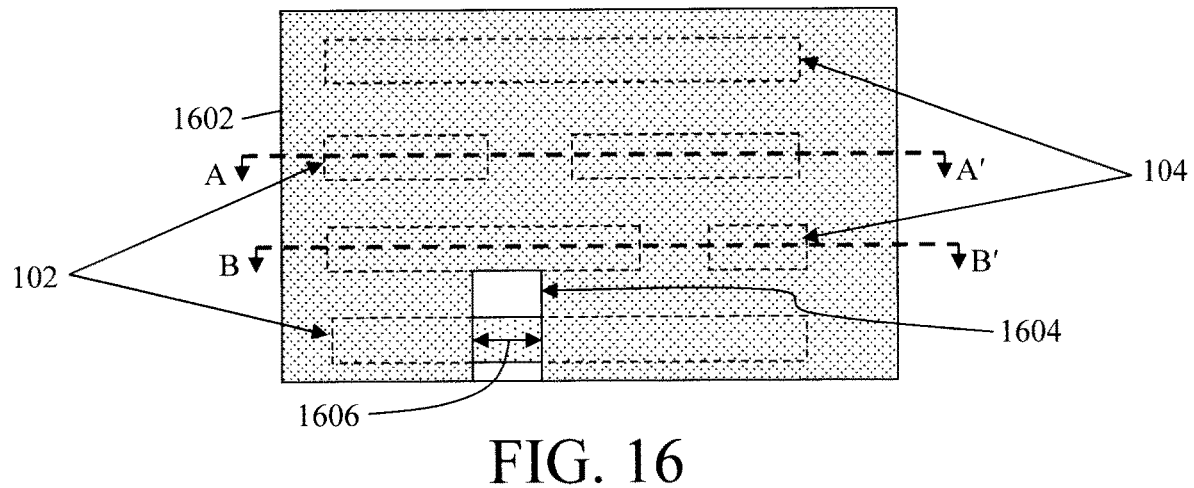
FIG. 16 is a top-down diagram illustrating a (third) cut mask having been formed over the first and second hardmasks having a window exposing the first hardmasks over one of the even metal lines, and the third cut mask having been used to pattern the first hardmask over the select even metal line forming a gap in the first hardmask according to an embodiment of the present invention.
Figure 17:
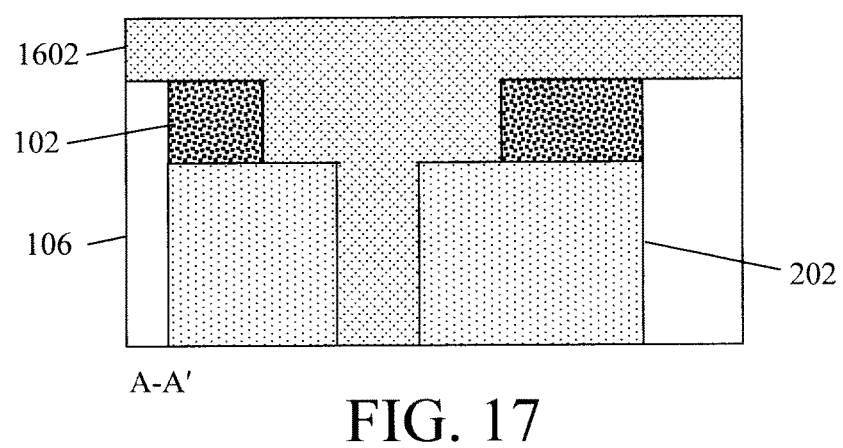
FIG. 17 is a cross-sectional diagram (A-A') illustrating that the (third) cut mask fills the first T-shaped cavity in the cut region of the select even metal line according to an embodiment of the present invention.

Non-line-end vias, i.e., top vias not over the end of a metal lines, can also be patterned in the respective first/second hardmasks 102/104 over even/odd metal lines 202/302, respectively. For instance, as shown in FIG. 16 (a top-down view), a (third) via mask 1602 is formed over the first and second hardmasks 102 and 104. A window 1604 (defining the via region) is present in via mask 1602 over one of the first hardmasks 102 over a select one of the even metal lines 202. According to an exemplary embodiment, via mask 1602 is formed from a multi-layer lithographic stack such as a photoresist/ARC/OPL stack. As shown in FIG. 17, a cross-sectional diagram (along line A-A'), via mask 1602 fills the T-shaped cavity 902 in the cut region of the select even metal line. In the same manner, via mask 1602 fills the T-shaped cavity 1502 in the cut region of the select odd metal line (although not explicitly shown in the figures).

Referring back to FIG. 16, via mask 1602 is then used to pattern the first hardmask 102 over the select even metal line 202 forming a gap 1606 in the first hardmask 102. As provided above, a plasma etching process using chlorine-containing plasma can be used to selectively etch hardmask 102. After the non-line-end via has been etched in first hardmask 102 over the select (even) metal line, via mask 1602 is removed.

Figure 18:
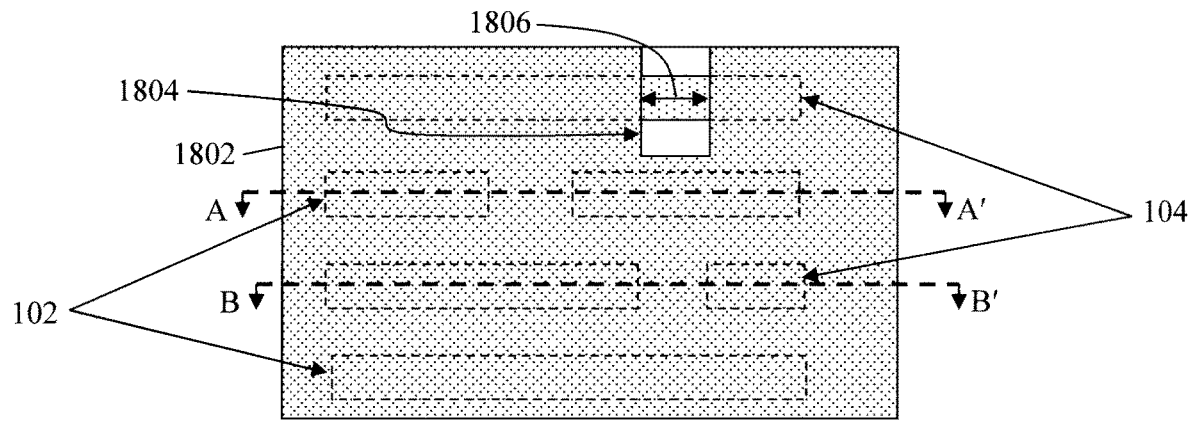
FIG. 18 is a top-down diagram illustrating a (fourth) cut mask having been formed over the first and second hardmasks having a window exposing the second hardmasks over one of the odd metal lines, and the fourth cut mask having been used to pattern the second hardmask over the select odd metal line forming a gap in the first hardmask according to an embodiment of the present invention.
Figure 19:
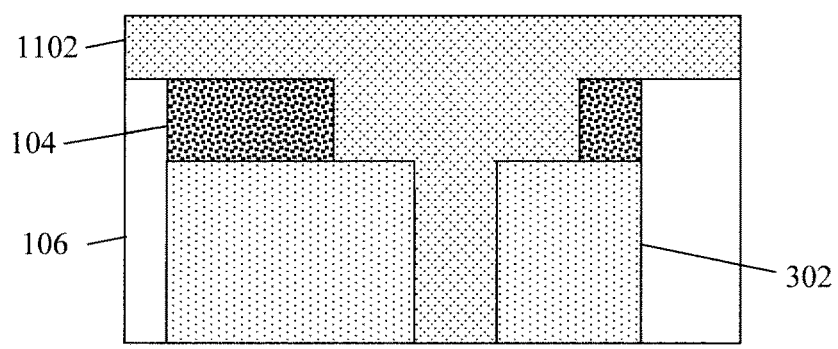
FIG. 19 is a cross-sectional diagram (A-A') illustrating that the (fourth) cut mask fills the second T-shaped cavity in the cut region of the select odd metal line according to an embodiment of the present invention.

The same process applies to forming non-line-end vias in the second hardmask 104 over a select odd metal line. For instance, as shown in FIG. 18 (a top-down view), a (fourth) via mask 1802 is formed over the first and second hardmasks 102 and 104. A window 1804 (defining the via region) is present in via mask 1802 over one of the second hardmasks 104 over a select one of the odd metal lines 302. According to an exemplary embodiment, via mask 1802 is formed from a multi-layer lithographic stack such as a photoresist/ARC/OPL stack. As shown in FIG. 19, a cross-sectional diagram (along line B-B'), via mask 1802 fills the T-shaped cavity 1502 in the cut region of the select odd metal line. In the same manner, via mask 1802 fills the T-shaped cavity 902 in the via region of the select even metal line (although not explicitly shown in the figures).

Figure 20:
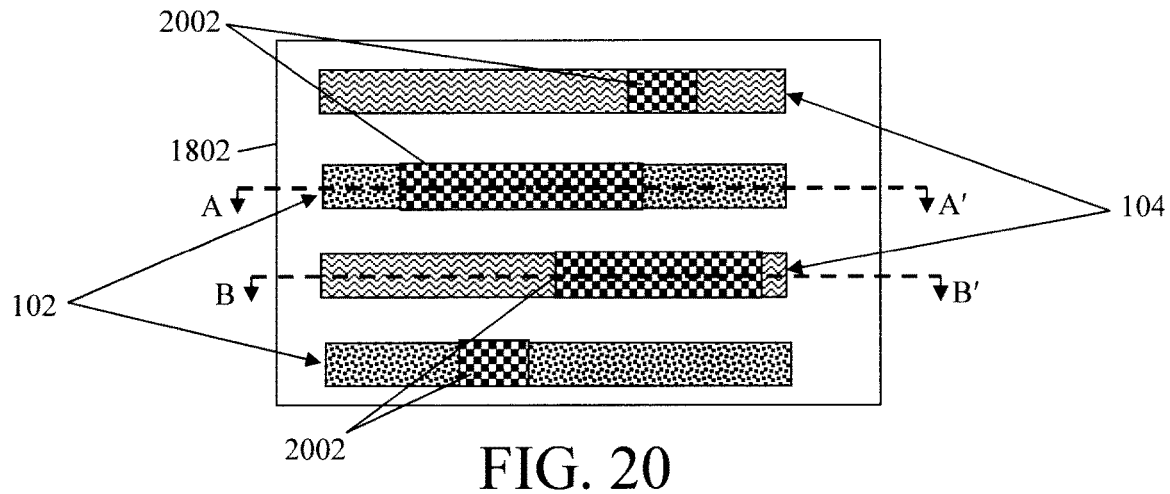
FIG. 20 is a top-down diagram illustrating a gap fill dielectric having been deposited into/filling the first/second T-shaped cavities in the cut regions of the select even/odd metal lines, and the (non-line-end) gaps in the first/second hardmasks according to an embodiment of the present invention.

Referring back to FIG. 18, via mask 1802 is then used to pattern the second hardmask 104 over the select odd metal line 302 forming a gap 1806 in the second hardmask 104. As provided above, a plasma etching process using fluorocarbon plasma can be used to selectively etch hardmask 104. After the non-line-end via has been etched in second hardmask 104 over the select (odd) metal line, via mask 1802 is removed A gap fill dielectric is then deposited into and filling the (line end) T-shaped cavities 902/1502 in the cut regions of the select even/odd metal lines, and the (non-line-end) gaps 1606/1806 in the first/second hardmasks 102/104, followed by a polishing process such as CMP to remove excess dielectric. Suitable gap fill dielectric materials include, but are not limited to silicon oxide (SiOx) and/or spin-on-glass (SoG). Namely, as shown in FIG. 20 (a top-down view), gap fill dielectric 2002 now fills the T-shaped cavities 902/1502 in the cut regions of the select even/odd metal lines, and the (non-line-end) gaps 1606/1806 in the first/second hardmasks 102/104.

Figure 21:
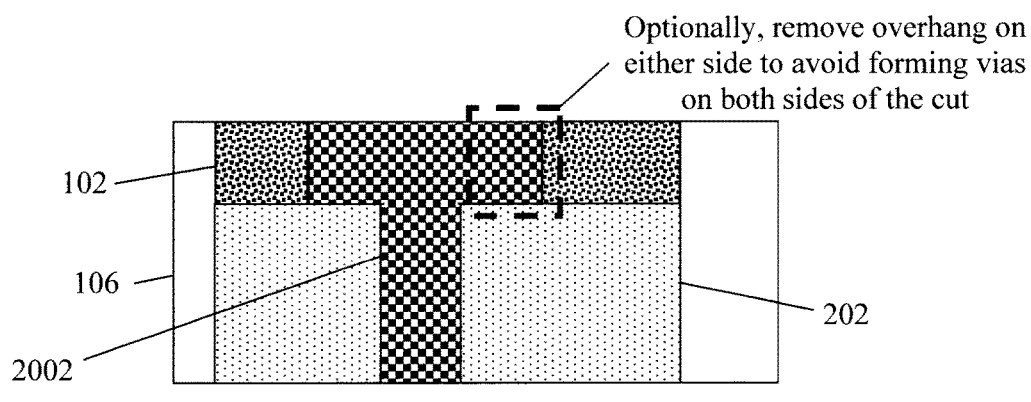
FIG. 21 is a cross-sectional diagram (A-A') illustrating the gap fill dielectric filling the first T-shaped cavity in the cut regions of the select even metal line according to an embodiment of the present invention.
Figure 22:
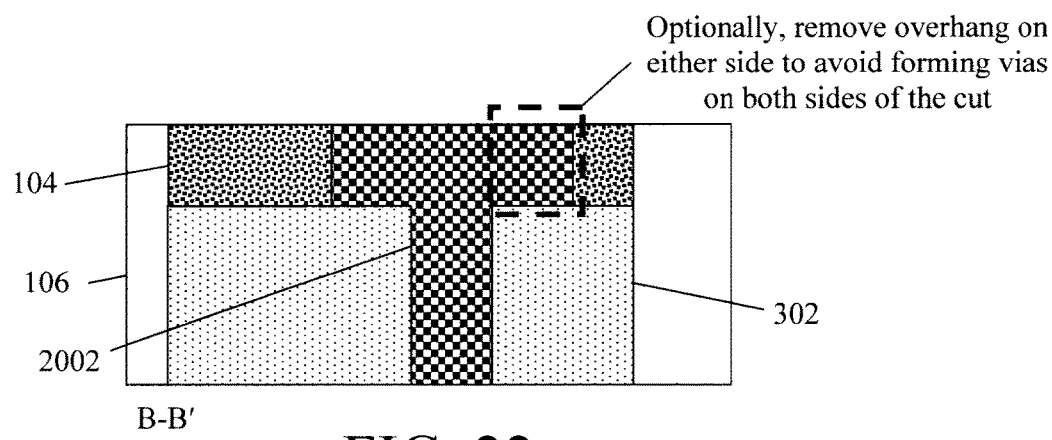
FIG. 22 is a cross-sectional diagram (B-B') illustrating the gap fill dielectric filling the second T-shaped cavity in the cut regions of the select odd metal line according to an embodiment of the present invention.

FIG. 21 is a cross-sectional diagram (along line A-A') illustrating gap fill dielectric 2002 filling the T-shaped cavity 902 in the cut regions of the select even metal line. FIG. 22 is a cross-sectional diagram (along line B-B') illustrating gap fill dielectric 2002 filling the T-shaped cavity 1502 in the cut regions of the select odd metal line. Optionally, one side overhang of the T-shaped gap fill dielectric 2002 can be removed, e.g., using an additional mask (not shown), to avoid forming vias on both sides of the cuts in both odd and even lines. This allows forming self-aligned via only on one side of the cut.

Figure 23:
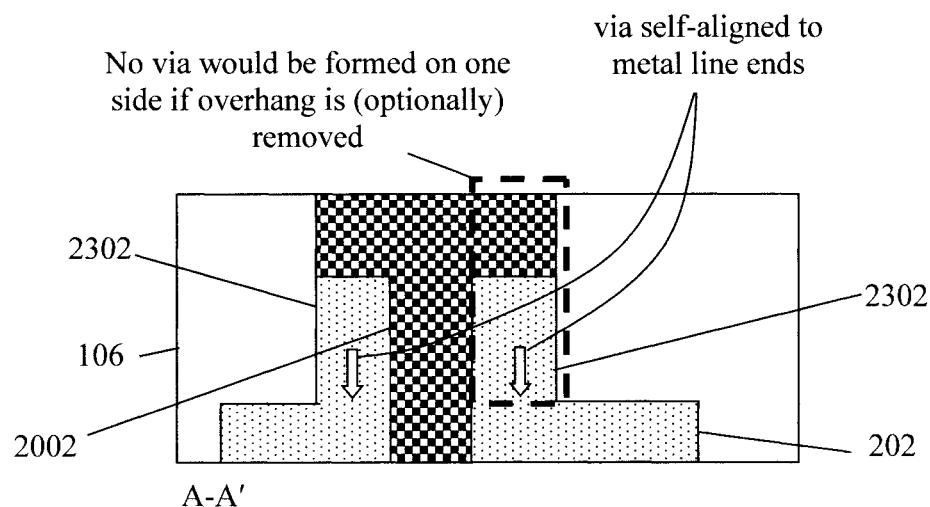
FIG. 23 is a cross-sectional diagram (A-A') illustrating the first hardmasks having been removed and the even metal lines having been recessed selective to the gap fill dielectric whereby a gap fill dielectric-covered portion of the even metal line at the line end does not get recessed, and forms a via self-aligned to the (even) line end according to an embodiment of the present invention.

The first/second hardmasks 102/104 are then removed using a hardmask and metal line etch selective to gap fill dielectric 2002. Namely, FIG. 23 is a cross-sectional diagram (along line A-A') illustrating the first hardmasks 102 having been removed and the even metal lines 202 having been recessed selective to gap fill dielectric 2002. Because of the configuration of the T-shaped cavity 902, gap fill dielectric 2002 overhangs/covers a portion of the even metal line 202 at the line end. As a result, this covered portion of the even metal line 202 at the line end does not get recessed, and forms via 2302 self-aligned to the (even) line end. This process also forms non-line-end vias (not shown). As provided above, a plasma etching process using chlorine-containing plasma can be used to selectively etch hardmask 102. A metal-selective RIE can be employed to recess the even metal lines 202 selective to gap fill dielectric 2002.

Figure 24:
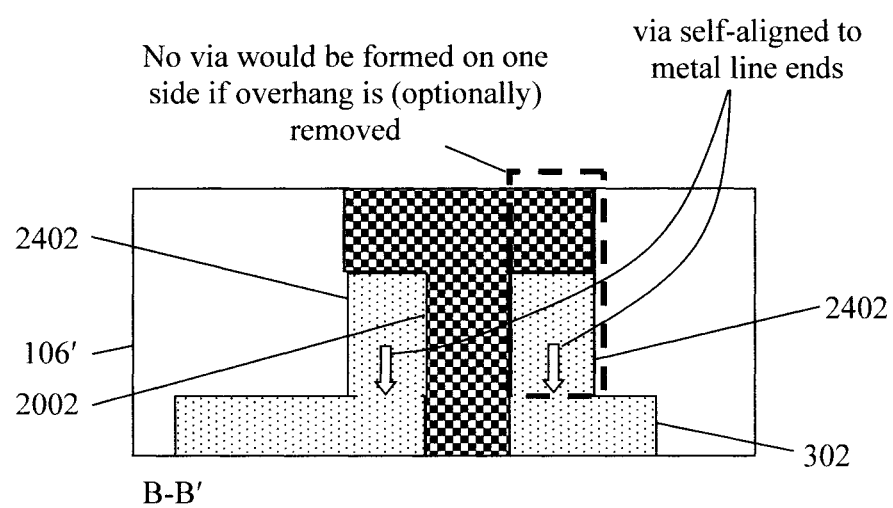
FIG. 24 is a cross-sectional diagram (B-B') illustrating the second hardmasks having been removed and the odd metal lines having been recessed selective to the gap fill dielectric whereby a gap fill dielectric-covered portion of the odd metal line at the line end does not get recessed, and forms a via self-aligned to the (odd) line end according to an embodiment of the present invention.

FIG. 24 is a cross-sectional diagram (along line B-B') illustrating the second hardmasks 104 having been removed and the odd metal lines 302 having been recessed selective to gap fill dielectric 2002. Due to T-shaped cavity 1502, gap fill dielectric 2002 overhangs/covers a portion of the odd metal line 302 at the line end. As a result, this covered portion of the odd metal line 302 at the line end does not get recessed, and forms vias 2402 self-aligned to the (odd) line end. This process also forms non-line-end vias (not shown). As provided above, plasma etching process using fluorocarbon plasma can be used to selectively etch hardmask 104. A metal-selective RIE can be employed to recess the odd metal lines 302 selective to gap fill dielectric 2002.

All of the above described processes can damage dielectric material 106. Thus, according to an exemplary embodiment, this damaged dielectric material 106 is removed and replaced with fresh dielectric material (now given reference numeral 106'). In that case, dielectric material 106' not only fills the spaces between lines but also the spaces between all top vias (line-end vias 2302, 2402 and other non-line-end vias) along lines.

Figure 25:
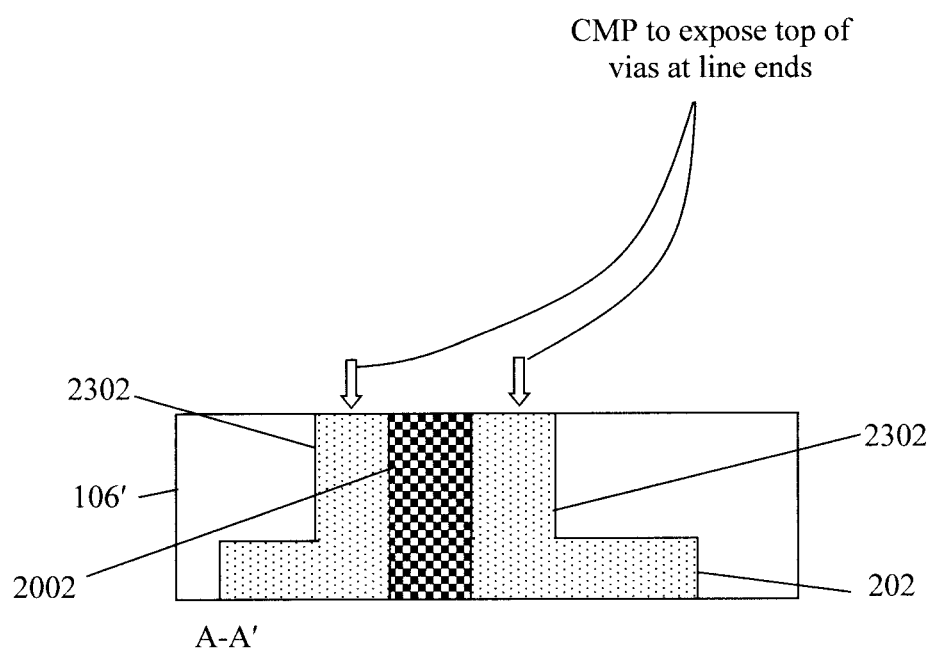
FIG. 25 is a cross-sectional diagram (A-A') illustrating the gap fill dielectric having been polished thereby exposing the tops of the via at the even line ends according to an embodiment of the present invention.

Finally, a process such as CMP is then employed to polish 106' overburden and the gap fill dielectric 2002 down to the vias 2302/2402, thereby exposing the tops of the vias 2302/2402 at the even/odd line ends. For instance, FIG. 25 is a cross-sectional diagram (along line A-A') illustrating the gap fill dielectric 2002 having been polished down to the vias 2302, thereby exposing the tops of the vias 2302 at the even line ends. The same configuration would be present with vias 2402 at the odd line ends.

As shown for example in FIG. 25, the resulting structure includes a cut in at least a select one of the (i.e., even and/or odd) metal lines. Vias (e.g., vias 2302 in FIG. 25) are perfectly aligned with the line ends of the select metal line on either side of the cut. For instance, as shown in FIG. 25, a sidewall of each of the vias 2302 is coplanar with the line ends of the select metal line. Gap fill dielectric 2002 is present in between the line ends.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming self-aligned vias at line ends, the method comprising the steps of:
    patterning metal lines comprising alternating even and odd metal lines using a hardmask comprising a first hardmask for patterning the even metal lines and a second hardmask for patterning the odd metal lines;
    cutting the hardmask and a select metal line, even or odd, using a cut mask having a window that exposes the hardmask over a cut region of the select metal line;
    enlarging the window in the cut mask to expose the hardmask on either side of the cut region of the select metal line;
    selectively etching the hardmask using the enlarged window in the cut mask to form a T-shaped cavity within the cut region of the select metal line;
    filling the T-shaped cavity with a gap fill dielectric;
    removing the hardmask; and
    recessing the metal lines selective to the gap fill dielectric, wherein the gap fill dielectric overhangs portions of the select metal line that, by the recessing, form the self-aligned vias at ends of the metal lines.

2. The method of claim 1, wherein the first hardmask and the second hardmask comprise different materials.

3. The method of claim 2, wherein the first hardmask comprises a material selected from the group consisting of: titanium (Ti), tantalum (Ta), titanium oxide (TiOx), titanium nitride (TiN), tantalum nitride (TaN), and combinations thereof.

4. The method of claim 2, wherein the second hardmask comprises a material selected from the group consisting of: silicon nitride (SiN), silicon carbon nitride (SiCN), hydrogen containing silicon carbon nitride (SiCNH), silicon carbide (SiC), and combinations thereof.

5. The method of claim 1, wherein the even and odd metal lines comprise a metal selected from the group consisting of: tungsten (W), cobalt (Co), ruthenium (Ru), and combinations thereof.

6. The method of claim 1, further comprising the step of:
    depositing a dielectric over the even metal lines, the odd metal lines, and the hardmask.

7. The method of claim 1, further comprising the steps of:
- patterning the hardmask over the select metal line using the cut mask; and
- transferring a pattern from the hardmask to the select metal line to cut the select metal line.

8. The method of claim 1, wherein a lateral etch is used to enlarge the window in the cut mask.

9. The method of claim 1, further comprising the step of:
- polishing the gap fill dielectric after the recessing.

10. The method of claim 1, further comprising the steps of:
- cutting the hardmask using a mask having a window that exposes the hardmask over a non-line-end of one of the metal lines to form a gap in the hardmask; and
- filling the gap in the hardmask with the gap fill dielectric, whereby the recessing of the metal lines selective to the gap fill dielectric in the gap forms a non-line-end via.

11. The method of claim 1, further comprising the step of:
- removing an overhang of the gap fill dielectric such that, by the recessing, a self-aligned via is formed at only one end of the select metal line.

12. A method of forming self-aligned vias at line ends, the method comprising the steps of:
- patterning metal lines comprising alternating even and odd metal lines using a hardmask comprising a first hardmask for patterning the even metal lines and a second hardmask for patterning the odd metal lines;
- cutting the first hardmask and a select one of the even metal lines using a first cut mask having a window that exposes the first hardmask over a cut region of the select even metal line;
- enlarging the window in the first cut mask to expose the first hardmask on either side of the cut region of the select even metal line;
- selectively etching the first hardmask using the enlarged window in the first cut mask to form a first T-shaped cavity within the cut region of the select even metal line;
- cutting the second hardmask and a select one of the odd metal lines using a second cut mask having a window that exposes the second hardmask over a cut region of the select odd metal line;
- enlarging the window in the second cut mask to expose the second hardmask on either side of the cut region of the select odd metal line;
- selectively etching the second hardmask using the enlarged window in the second cut mask to form a second T-shaped cavity within the cut region of the select odd metal line;
- filling the first T-shaped cavity and the second T-shaped cavity with a gap fill dielectric;
- removing the first hardmask and the second hardmask; and
- recessing the metal lines selective to the gap fill dielectric, wherein the gap fill dielectric overhangs portions of the select even metal line and the select odd metal line that, by the recessing, form the self-aligned vias at ends of the metal lines.

13. The method of claim 12, wherein the first hardmask and the second hardmask comprise different materials.

14. The method of claim 13, wherein the first hardmask comprises a material selected from the group consisting of: Ti, Ta, TiOx, TiN, TaN, and combinations thereof.

15. The method of claim 13, wherein the second hardmask comprises a material selected from the group consisting of: SiN, SiCN, SiCNH, SiC, and combinations thereof.

16. The method of claim 12, further comprising the step of:
- polishing the gap fill dielectric after the recessing.

17. The method of claim 12, further comprising the steps of:
- cutting the first hardmask using a mask having a window that exposes the first hardmask over a non-line-end of one of the even metal lines to form a gap in the first hardmask; and
- filling the gap in the first hardmask with the gap fill dielectric, whereby the recessing of the metal lines selective to the gap fill dielectric in the gap in the first hardmask forms a non-line-end via.

18. The method of claim 17, further comprising the steps of:
- cutting the second hardmask using another mask having a window that exposes the second hardmask over a non-line-end of one of the odd metal lines to form a gap in the second hardmask; and
- filling the gap in the second hardmask with the gap fill dielectric, whereby the recessing of the metal lines selective to the gap fill dielectric in the gap in the second hardmask forms another non-line-end via.

19. A method of forming self-aligned vias at line ends, the method comprising the steps of:
- patterning metal lines comprising alternating even and odd metal lines using a hardmask comprising a first hardmask for patterning the even metal lines and a second hardmask for patterning the odd metal lines;
- cutting the first hardmask and a select one of the even metal lines using a first cut mask having a window that exposes the first hardmask over a cut region of the select even metal line;
- enlarging the window in the first cut mask to expose the first hardmask on either side of the cut region of the select even metal line;
- selectively etching the first hardmask using the enlarged window in the first cut mask to form a first T-shaped cavity within the cut region of the select even metal line;
- cutting the second hardmask and a select one of the odd metal lines using a second cut mask having a window that exposes the second hardmask over a cut region of the select odd metal line;
- enlarging the window in the second cut mask to expose the second hardmask on either side of the cut region of the select odd metal line;
- selectively etching the second hardmask using the enlarged window in the second cut mask to form a second T-shaped cavity within the cut region of the select odd metal line;
- cutting the first hardmask using a mask having a window that exposes the first hardmask over a non-line-end of one of the even metal lines to form a gap in the first hardmask;
- cutting the second hardmask using another mask having a window that exposes the second hardmask over a non-line-end of one of the odd metal lines to form a gap in the second hardmask;
- filling the first T-shaped cavity, the second T-shaped cavity, the gap in the first hardmask, and the gap in the second hardmask with a gap fill dielectric;
- removing the first hardmask and the second hardmask; and
- recessing the metal lines selective to the gap fill dielectric, wherein the gap fill dielectric overhangs portions of the even metal lines that, by the recessing, form the self-aligned vias at ends of the even and odd metal lines, and wherein the recessing of the metal lines selective to the gap fill dielectric in the gap in the first hardmask and the gap fill dielectric in the gap in the second hardmask forms non-line-end vias.

20. The method of claim 19, wherein the first hardmask comprises a material selected from the group consisting of: Ti, Ta, TiOx, TiN, TaN, and combinations thereof.

21. The method of claim 19, wherein the second hardmask comprises a material selected from the group consisting of: SiN, SiCN, SiCNH, SiC, and combinations thereof.

22. A structure, comprising:
   metal lines;
   a cut in a select one of the metal lines;
   vias aligned with line ends of the select metal line on either side of the cut; and
   a gap fill dielectric in between the line ends and in direct contact with the vias.

23. The structure of claim 22, wherein a sidewall of each of the vias is coplanar with the line ends of the select metal line.

24. The structure of claim 22, wherein the metal lines comprise a metal selected from the group consisting of: W, Co, Ru, and combinations thereof.

* * * * *